(12) United States Patent
Wurm

(10) Patent No.: US 8,467,744 B2
(45) Date of Patent: Jun. 18, 2013

(54) SIGNAL PROCESSING DEVICE AND METHOD, RADIOFREQUENCY TRANSMISSION SYSTEM INCLUDING SUCH A DEVICE

(75) Inventors: Patrick Wurm, Voreppe (FR); Claire Wurm, legal representative, Strasbourg (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 140 days.

(21) Appl. No.: 13/132,810

(22) PCT Filed: Dec. 16, 2009

(86) PCT No.: PCT/FR2009/052580
§ 371 (c)(1),
(2), (4) Date: Jun. 3, 2011

(87) PCT Pub. No.: WO2010/070231
PCT Pub. Date: Jun. 24, 2010

(65) Prior Publication Data
US 2012/0147994 A1   Jun. 14, 2012

(30) Foreign Application Priority Data

Dec. 17, 2008 (FR) ...................................... 08 58676
Jan. 13, 2009 (FR) ...................................... 09 50161

(51) Int. Cl.
*H04B 1/02* (2006.01)
*H04B 1/04* (2006.01)

(52) U.S. Cl.
CPC .................................. *H04B 1/0483* (2013.01)
USPC .......................... 455/102; 455/127.1; 375/298

(58) Field of Classification Search
CPC ........................................................ H04B 1/048
USPC .................. 455/550.1, 552.1, 553.1, 91, 102, 455/103, 108, 110, 115.1, 127.1, 127.2; 375/295, 296, 298
See application file for complete search history.

(56) References Cited

U.S. PATENT DOCUMENTS

| | | | |
|---|---|---|---|
| 6,311,046 B1* | 10/2001 | Dent | 455/91 |
| 7,043,213 B2* | 5/2006 | Robinson et al. | 455/127.2 |
| 2011/0111711 A1* | 5/2011 | Bo | 455/127.1 |

OTHER PUBLICATIONS

Helaoui, Mohamed; et al. "A New Mode-Multiplexing LINC Architecture to Boost the Efficiency of WiMAX Up-Link Transmitters." IEEE Transactions on Microwave Theory and Techniques, vol. 55, No. 2. pp. 248-253 (Feb. 2007).

(Continued)

*Primary Examiner* — Thanh Le
(74) *Attorney, Agent, or Firm* — Oblon, Spivak, McClelland, Maier & Neustadt, L.L.P.

(57) ABSTRACT

A device for processing a signal carrying information to be transmitted using a radiofrequency signal, for transformation of the signal into two signals of identical amplitude phase-shifted respectively relative to the information-carrying signal according to two variable and opposing phase shifts. The device includes a mechanism transforming the information-carrying signal. The device transforms the information-carrying signal into two signals of constant amplitude and of variable phase shifts according to values of the information-carrying signal, for as long as the amplitude of the information-carrying signal is greater than a predetermined value, and transforms the information-carrying signal into two signals of variable amplitude according to the values of the information-carrying signal, when the amplitude of the information-carrying signal is less than the predetermined value.

10 Claims, 5 Drawing Sheets

OTHER PUBLICATIONS

Wurm, Patrick; et al. "Radio Transmitter Architecture with All-Digital Modulator for Opportunistic Radio and Modern Wireless Terminals." Cognitive Radio and Advanced Spectrum Management. pp. 1-4 (Feb. 14, 2008).

Zhang, X.; et al. "Calibration scheme for LINC transmitter." Electronics Letters, vol. 37, No. 5. XP 6016330. pp. 317-318 (Mar. 1, 2001).

Huttunen, Anu; et al. "A 20-W Chireix Outphasing Transmitter for WCDMA Base Stations." IEEE Transactions on Microwave Theory and Techniques, vol. 55, No. 12. pp. 2709-2718 (Dec. 2007).

International Search Report issued Mar. 25, 2010 in PCT/FR09/52580, filed Dec. 16, 2009.

* cited by examiner

SIGNAL PROCESSING DEVICE AND METHOD, RADIOFREQUENCY TRANSMISSION SYSTEM INCLUDING SUCH A DEVICE

BACKGROUND OF THE INVENTION

1. Field of the Invention

The present invention concerns a device for processing a signal carrying information intended to be transmitted using a radiofrequency signal. It also concerns a radiofrequency transmission system including such a device and a corresponding method.

The invention applies more specifically to the radiofrequency transmission of data using wireless communication terminals such as mobile telephones, for example, and more specifically using wireless terminals capable of transmitting in a broad range of power ratings, and according to several separate transmission standards.

2. Description of the Related Art

Each standard, for example GSM, EDGE, WCDMA, HSDPA, 3G, 4G, WIFI, WIMAX, 802.11, 802.16, etc., transmits in a specific transmission frequency band in the band of frequencies of the radio waves. In addition each standard transmits with a particular modulation.

Thus, a radiofrequency transmitter suitable for transmitting according to a particular standard is not generally suitable for transmitting according to another standard. For example, the architecture of a radiofrequency transmitter according to the GSM standard is based on GMSK-type constant-amplitude direct modulation, and therefore generally includes an analog modulator, the output of which is connected to a power amplifier. Conversely, the architecture of a radiofrequency transmitter according to the EDGE standard is based on a 8-PSK-type modulation with non-constant amplitude, generally with a polar loop. But an architecture with a polar loop is restricted in terms of the bandwidth of the transmitted signals and has difficulty transmitting signals with greater bandwidth than that allowed by the EDGE standard. In addition, in the case of greater bandwidth transmissions, such as those designed for the 3G and 4G standards, using an OFDM-type modulation, a direct-modulation architecture with linear amplification is generally favoured.

At the current time, to manage all these standards and the incompatibility of their respective architectures, multi-standard terminals are designed using several transmission microelectronic devices, each one being dedicated to one particular standard. This short-term solution, consisting in incorporating several microelectronic transmission devices in a single multi-standard terminal, is costly and inefficient. It leads to a duplication of radiofrequency emission functions in a single terminal, which then becomes bulky.

There is therefore a genuine need for a device which processes a signal carrying information intended to be transmitted using a transmission terminal of radiofrequency signals which can enable an architecture to be designed which is capable of covering a wide band of frequencies, of supporting multiple types of modulation, and of reacting instantly to a large number of possible user requests.

In terms of performance, such an architecture will also be judged by its ability to supply sufficient power at the lowest possible level of energy consumption, since it is generally intended to be installed in a mobile terminal, by its ability to allow transmissions of high-bandwidth data, and by a high signal-to-noise ratio.

For example, polar loop architecture is very efficient in terms of energy consumption, since it requires only a moderately non-linear amplification with satisfactory efficiency in terms of power gain.

But in the case of broadband transmissions, a linear amplification architecture is generally unavoidable. Indeed, to obtain greater spectral efficiency, in this type of transmission the signals are modulated in terms of phase and amplitude according to the following polar representation: $s(t)=A(t)\cdot\exp(j\cdot(\omega t+\theta(t)))$. According to this polar representation, the expression $A(t)$ is the, always positive, amplitude of the signal, the expression $\theta(t)$ is the phase and $\omega$ is the carrier. And variable amplitude signals generally require that linear-response amplifiers are used to prevent distortions. Since each amplifier is limited in terms of linearity by its AM/AM and AM/PM characteristics, this implies that amplifiers are used which operate in linear fashion in a zone sufficiently far removed from their saturation gain, and this makes the transmission system inefficient since these amplifiers are then less efficient in terms of energy consumption.

The architecture known by the name LINC ("Linear amplification using Nonlinear Components") provides a solution to allow linear amplification of variable amplitude signals using amplifiers operating with gain saturation, i.e. with maximum efficiency for high power levels. This architecture also enables control loops, such as polar loops, to be avoided.

This architecture uses a device which processes in baseband a signal $s(t)=A(t)\cdot\exp(j\cdot\theta(t))$ carrying information intended to be transmitted using a radiofrequency signal, for the transformation of this signal into two signals of identical and constant amplitude $A_C$, which are phase-shifted respectively relative to the information-carrying signal according to two variable and opposing phase-shifts:

$$s_1(t)=A_C\cdot\exp(j\varphi(t))\cdot\exp(j\cdot\theta(t)), \text{ and}$$

$$s_2(t)=A_C\cdot\exp(-j\varphi(t))\cdot\exp(j\cdot\theta(t)).$$

Thus, as a vector representation, the information-carrying baseband signal $s(t)$ is seen as the sum of these two constant amplitude $A_C$ signals, the opposing respective phase-shifts of which $\varphi(t)$ and $-\varphi(t)$ are a function of the variable amplitude of the information-carrying signal.

More specifically:

$$A_C = \frac{\max[A(t)]}{2}, \text{ and}$$

$$\varphi(t) = \cos^{-1}\left[\frac{A(t)}{2A_C}\right].$$

Both these constant-amplitude signals can then be modulated (factor $\exp(j\cdot\omega t)$) and amplified according to two independent modulation and amplification channels, before being recombined before transmission. There is no requirement that the amplification in each of the two channels should be linear, since neither of these signals carries any amplitude information. The amplifiers subjected to this technique are therefore advantageously used in their saturation zone in order to improve the overall efficiency of the radiofrequency transmission system.

Indeed, let $G=G_{SAT}\cdot\exp(j0)$ be the common transfer function of the amplifiers of the two modulation and amplification channels, at saturation.

At the output of the first modulation and amplification channel the first of the two constant-amplitude signals takes the following form:

$$s_{O,1}(t)=G_{SAT}\cdot s_1(t)=G_{SAT}\cdot A_C\cdot\exp(j\cdot\varphi(t)+j\cdot\omega\cdot t+j\cdot\theta(t)).$$

At the output of the second modulation and amplification channel, the second of the two constant-amplitude signals takes the following form:

$$s_{O,2}(t)=G_{SAT}\cdot s_2(t)=G_{SAT}\cdot A_C\cdot\exp(-j\cdot\varphi(t)+j\cdot\omega\cdot t+j\cdot\theta(t)).$$

By recombination of these two independently modulated and amplified signals, one obtains:

$s_O(t) = s_{O,1}(t) + s_{O,2}(t)$, such that $s_O(t) = G_{SAT} \cdot A_C \cdot \exp(j \cdot \varphi(t) + j \cdot \omega \cdot t + j \cdot \theta(t)) + G_{SAT} \cdot A_C \cdot \exp(-j \cdot \varphi(t) + j \cdot \omega \cdot t + j \cdot \theta(t))$, $s_O(t) = [G_{SAT} \cdot A(t)] \cdot \exp(j \cdot (\omega t + \theta(t)))$, hence $s_O(t) = G_{SAT} \cdot s(t)$.

Amplification of the signal s(t) is therefore effectively linear, although this signal is variable in amplitude, and although the amplifiers are used with gain saturation.

In terms of power supplied compared to power consumed, if it is supposed that in all hypotheses a post-amplification filtering at −3 dB of losses is necessary and achievable, to supply for example a signal at +30 dBm to the transmission antenna, a single-amplifier architecture must supply a signal at +33 dBm at the output of the single amplifier, and at +27 dBm at the output of the single amplifier to supply, for example, a signal at +24 dBm. In order for the amplifier to operate in its zone of linearity, generally with a margin of 4 dB compared to its saturation gain, it must therefore be designed to support +37 dBm at saturation, if it is desired to transmit a signal at +30 dBm. Assuming 50% efficiency, this generally gives a consumption level of between 5 and 10 W, depending on the class of the amplifier. Such an architecture with this type of performance is, for example, described in the article by P. Wurm and A. Shirakawa, entitled "Radio transmitter architecture with all-digital modulator for opportunistic radio and modern wireless terminals", CogART 2008, Proceedings on 2008 First International Workshop on Cognitive Radio and Advanced Spectrum Management, 14 Feb. 2008.

As a comparison, an LINC-type architecture with two amplification channels must provide a signal at +27 dBm (for $\varphi=0$) at the output of each amplifier in order to provide a signal at +30 dBm to the transmission antenna: indeed, in this architecture, the post-amplification filtering at −3 dB of losses can also perform the function of a module which recombines both the constant-amplitude signals. For $\varphi=60°$ and for a signal at +27 dBm at the output of each amplifier, the signal supplied to the transmission antenna is at +24 dBm. Assuming an efficiency of 50%, this gives a consumption level of 2 W since the LINC architecture is still operating at saturation.

LINC architecture is therefore clearly advantageous since it provides a way of avoiding the traditional conflict between linearity and energy consumption which generally requires that compromises are made in the choice and design of the amplifiers.

Of course, this architecture theoretically requires that both the modulation and amplification channels are operating identically in order that the recombination of both constant amplitude signals allows, at the output of amplification, that the modulated information-carrying signal, which is amplified in the antenna of the radiofrequency transmission terminal, is regained.

In practice, LINC architecture poses a first problem since the transformation of the variable-amplitude information-carrying signal into two constant amplitude signals is not by its nature linear. This transformation broadens the spectrum of the transmitted signal, which pushes to their limits the capacities of the radiofrequency transmission system in terms of bandwidth, notably, for example, when considering broad-band applications such as WCDMA applications. As a consequence, in the case of multi-standard applications, traditional LINC architecture rapidly reaches its limits.

Also in practice, LINC architecture is particularly sensitive to any gain or phase shift between the two modulation and amplification channels. And such shifts are inevitable, notably in the amplification part of these channels. It has been shown, for example, that a modulated OFDM signal, recombined after processing over two modulation and amplification channels, having a 5% gain shift (i.e. 0.42 dB) and a 3° phase shift, can have a spectrum which does not check the constraints of the OFDM spectral mask. As a consequence, LINC architecture requires very precise calibration of the two modulation and application channels.

Notably, in a range of possible values, the lower the amplitude of the information-carrying signal the more the calibration inaccuracies have consequences for its recombination.

For example, if the amplitude shift is zero between the two channels, i.e. if $|s_{O,1}(t)| = |s_{O,2}(t)| = G_{SAT} \cdot A_C$ (omitting the term $\exp(j \cdot (\omega t + \theta(t)))$ in the equations, which does not impair the validity of the calculations, which relate to signal amplitudes), the amplitude of signal $s_O(t)$ is:

$-|s_O(t)| = 2 \cdot G_{SAT} \cdot A_C$ for $\varphi = 0$, $-|s_O(t)| = G_{SAT} \cdot A_C$ for $\varphi = 60°$, and $-|s_O(t)| = 0.2 \cdot G_{SAT} \cdot A_C$ for $\varphi = 84.26°$, i.e. a dynamic of 20 dB between 0 and 84.26°.

If the shift is ±5% in terms of amplitude between the two channels, i.e. if $|s_{O,1}(t)| = 1.05 \cdot G_{SAT} \cdot A_C$ and $|s_{O,1}(t)| = 0.95 \cdot G_{SAT} \cdot A_C$ for example, the amplitude of signal $s_O(t)$ is:

$-|s_O(t)| = 2 \cdot G_{SAT} \cdot A_C$ for $\varphi = 0$, $-|s_O(t)| = 1.0037 \cdot G_{SAT} \cdot A_C$ for $\varphi = 60°$, with a phase equal to $\arg[s_O(t)] = 4.94°$, and $-|s_O(t)| = 0.223 \cdot G_{SAT} \cdot A_C$ for $\varphi = 84.26°$, with a phase equal to $\arg[s_O(t)] = 26.4°$, and i.e. a dynamic of 19 dB between 0 and 84.26°.

This example shows, firstly, that the dynamic is reduced by 1 dB due to the ±5% amplitude shift between the two channels and, secondly, that the consequences for the recombined signal are greater at low amplitude. Thus, at maximum amplitude ($\varphi = 0$) the impact is zero, at half the maximum amplitude ($\varphi = 60°$) the impact is limited, whereas at low amplitude, for example $\varphi = 84.26°$, the impact becomes truly appreciable.

More generally, signals with a large dynamic will be affected by a change to a LINC architecture with imperfect calibration.

SUMMARY OF THE INVENTION

It can thus be desirable to have a device for processing a signal carrying information intended to be transmitted using a radiofrequency signal which enables the abovementioned problems and constraints to be overcome.

An object of the invention is therefore a device for processing a signal carrying information intended to be transmitted using a radiofrequency signal, for the transformation of this signal into two signals of identical amplitude phase-shifted respectively relative to the information-carrying signal according to two variable and opposing phase shifts, including means for transforming the information-carrying signal designed to:

transform the information-carrying signal into two signals of constant amplitude and of variable phase shifts according to the values of the information-carrying signal, for as long as the amplitude of the information-carrying signal is greater than a predetermined value, and transform the information-carrying signal into two signals of variable amplitude according to the values of the information-carrying signal, when the amplitude of the information-carrying signal is less than this predetermined value.

Thus, a processing device according to the invention resembles a LINC architecture device provided the information-carrying signal is sufficiently high that the LINC-type processing is not penalised by imperfect calibration, but limits the opposing phase shifts of the two identical-amplitude signals, by altering their amplitudes when the amplitude of the information-carrying signal is no longer sufficiently high. It therefore has the advantages of a LINC-type device, whilst limiting its disadvantages.

Optionally, the means of transformation are designed to transform the information-carrying signal into two signals of constant phases which are set in absolute value terms at a maximum value, and of amplitudes which vary according to the values of the information-carrying signal, when the amplitude of the information-carrying signal is less than the predetermined value.

Also optionally, the predetermined value is defined according to a distribution of the amplitude of the information-carrying signal.

Another purpose of the invention is a system for transmitting radiofrequency signals including:

means of production of an information-carrying complex signal to be modulated, a processing device as defined above, for the transformation of this complex signal into two signals of identical amplitude, means for modulating the two identical-amplitude signals including two separate modulation channels, means for recombining the two modulated signals of identical amplitude for the formation of a radiofrequency signal to be transmitted, and means of transmission of this radiofrequency signal.

Optionally, the means of production, the processing device and the means of modulation are digital, and each modulation channel includes at least one digital sigma-delta modulator.

Also optionally, the means of recombination are analog, and the system further includes:

means of digital/analog conversion of both the identical-amplitude signals originating from the means of modulation, for the supply of two analog signals, means of band-pass filtering of the two analog signals in a predetermined transmission frequency band, and means of amplification of the two filtered analog signals for the supply of two filtered and amplified analog signals to the means of recombination.

Also optionally, a system according to the invention can further include an internal calibration circuit designed to compensate for a gain and phase shift of the means of amplification of both filtered analog signals.

Also optionally, a system according to the invention can further include an internal predistortion circuit designed to compensate for a gain and/or phase non-linearity of the means of amplification of both filtered analog signals.

Also optionally, the internal calibration circuit and the internal predistortion circuit are formed by a single circuit including a coupling device forming part of the means of recombination to recover a portion of the radiofrequency signal transmission power, and a logarithmic amplifier to transform this recovered portion into a voltage which can be used by the processing device.

Finally, another object of the invention is a method for processing a signal carrying information intended to be transmitted using a radiofrequency signal, for the transformation of this signal into two signals of identical amplitude phase-shifted respectively relative to the information-carrying signal according to two variable and opposing phase shifts, including the following steps:

transform the information-carrying signal into two signals of constant amplitude and of variable phase shifts according to the values of the information-carrying signal, for as long as the amplitude of the information-carrying signal is greater than a predetermined value, and transform the information-carrying signal into two signals of variable amplitude according to the values of the information-carrying signal, when the amplitude of the information-carrying signal is less than this predetermined value.

BRIEF DESCRIPTION OF THE DRAWINGS

The invention will be better understood by means of the following description, given solely as an example, and made in reference to the appended illustrations, in which.

DETAILED DESCRIPTION OF THE INVENTION

Figure 1:
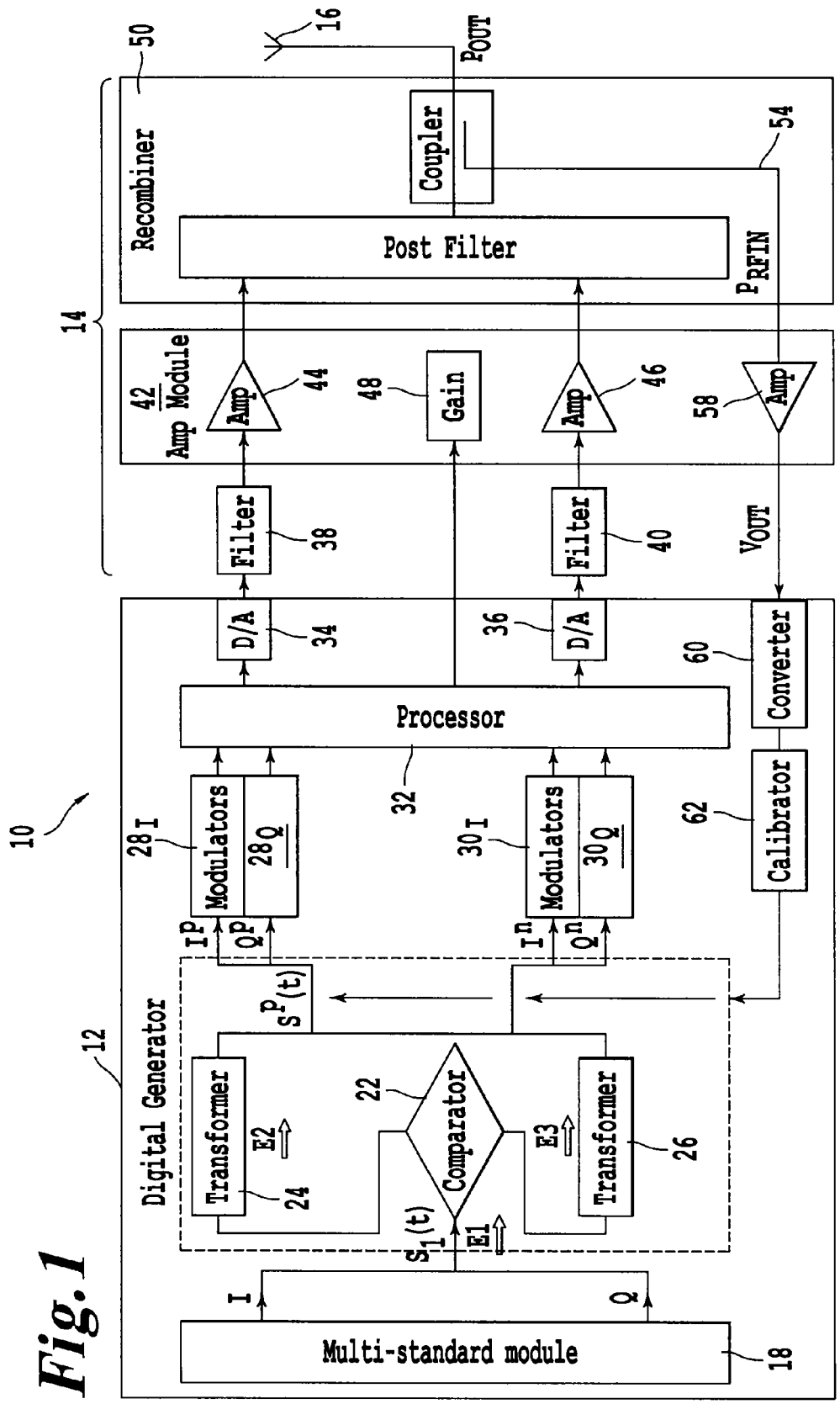
FIG. 1 represents diagrammatically the general structure of a system of transmission of radiofrequency signals according to the invention.

The system 10 of transmission of radiofrequency signals represented in FIG. 1 includes a generator 12 of radiofrequency signals, a stage 14 for filtering and amplifying radiofrequency signals produced by the generator 12 and a transmission antenna 16 for the transmission by radio waves of the amplified radiofrequency signals supplied by the filtering and amplification stage 14.

For the implementation of the invention, the generator 12 of radiofrequency signals can be at least partially analog, but in a preferred embodiment it is digital: it is designed on the basis of a CMOS-type microelectronic circuit, for example, capable of operating at radiofrequencies.

Indeed, the traditional analog solutions are very sensitive to variations in temperature, frequency and processing, whereas a digital solution enables more predictable signals to be generated. In addition, analog signals use external components the settings of which are difficult to modify. On the contrary, a fully digital circuit with a CMOS technology base has a high degree of flexibility since it is programmable and reconfigurable. It therefore enables an architecture to be envisaged which is capable of covering a wide range of frequencies and of supporting multiple types of modulations according to many possible standards, by enabling radiofrequency signals of very varied types to be generated. It supports, for example, at least the abovementioned GSM, EDGE, WCDMA, HSDPA, 3G, 4G, WIFI, WIMAX, 802.11 and 802.16 standards, etc.

The digital generator 12 thus includes a multi-standard module 18 which produces a complex digital signal carrying information intended to be transmitted using a radiofrequency signal. This complex digital signal is produced as a baseband according to a format imposed by any of the standards supported by the digital generator 12, and can be written, as Cartesian or polar coordinates, as follows:

$$s_I(t)=I(t)+j \cdot Q(t)=A_I(t) \cdot \exp(j \cdot \theta(t)).$$

The real digital signals in quadrature I and Q are produced at a predetermined sampling frequency and quantified over N bits, for example in practice over six, eight or ten bits.

If applicable, the multi-standard production module 18 can include a digital filtering device, for example of the RRC-type ("Root Raised Cosine") or equivalent, to limit the spectral spread of the complex digital signal produced to the breadth of the envisaged transmission channel.

It can further include an oversampling device connected to the digital filtering device to raise the complex digital signal produced at the output of the digital filtering device to a sampling frequency which is higher than the predetermined sampling frequency, by interpolation and decimation.

The abovementioned digital filtering and oversampling devices are not represented in FIG. 1 and will not be described in detail in the remainder of the description, given that they are well known from the state of the art.

According to a first aspect of the invention the digital generator 12 also includes a digital device 24 processing the complex digital information-carrying signal $s_I(t)$, to transform this signal into two identical-amplitude signals $s^p(t)$ and $s''(t)$ which are phase-shifted respectively compared to the information-carrying signal according to two variable and opposing phase shifts. Generally, these identical-amplitude signals can be written, in Cartesian or polar coordinates, as follows:

$$s^p(t)=I^p(t)+j \cdot Q^p(t)=A(t) \cdot \exp(j \cdot \phi(t)+j \cdot \theta(t)), \text{ and}$$

$$s''(t)=I''(t)+j \cdot Q''(t)=A(t) \cdot \exp(-j \cdot \phi(t)+j \cdot \theta(t)).$$

More specifically, the digital processing device 20 includes means 22 for comparing the variable amplitude $A_I(t)$ of the information-carrying signal $s_I(t)$ with a constant predetermined value $A_{MIN}$, for example defined as being equal to half the maximum value which this amplitude $A_I(t)$ can take. For greater flexibility, this predetermined value $A_{MIN}$ can also be adjustable. It can notably be defined in terms of the distribution of the variable amplitude $A_I(t)$ of the information-carrying signal.

At the output of these means of comparison 22, if the amplitude of the information-carrying signal is greater than this predetermined value $A_{MIN}$, the latter is processed by the first means 24 of transformation of the information-carrying signal into two constant-amplitude signals, the phase shifts of which vary according to the values of the information-carrying signal. This first process corresponds to the previously described LINC architecture.

If, on the contrary, the amplitude of the information-carrying signal is less than this predetermined value $A_{MIN}$ the signal is processed by second means 26 of transformation of the information-carrying signal into two variable-amplitude signals according to the values of the information-carrying signal. This enables the phase-shift values $\phi(t)$ to be limited, and also enables the amplitude values of both identical-amplitude signals to be altered when transforming the information-carrying signal. Indeed, at the output of the digital processing device 20 both identical-amplitude signals are intended to follow two separate modulation, filtering and amplification channels, before being recombined to form a radiofrequency signal to be transmitted. The limitation of the phase-shift values $\phi(t)$ enables the impact of a gain or phase shift of these two processing channels to be limited, as was seen above.

The means 22, 24 and 26 are represented as functionally separate in FIG. 1 for the sake of clarification, but can very easily be implemented in the same programmed microelectronic circuit forming the digital processing device 20. Their operation will be described in detail in due course, with reference to FIGS. 2A to 2C.

The digital generator 12 includes, at the output of the digital processing device 20, means 28$_I$, 28$_Q$, 30$_I$, 30$_Q$ of modulation of both identical-amplitude signals $s^p(t)$ and $s''(t)$ including two separate modulation channels which process independently. A first channel 28$_I$, 28$_Q$ processes the real and imaginary parts $I^p$ and $Q^p$ of the first $s^p(t)$ of the two signals. A second channel 30$_I$, 30$_Q$ processes the real and imaginary parts $I''$ and $Q''$ of the second $s''(t)$ of the two signals.

More specifically, in an embodiment of the invention, the first channel 28$_I$, 28$_Q$ includes two sigma-delta modulators to accomplish a modulation at the desired transmission carrier frequency of the signals $I^p$ and $Q^p$. One of these two sigma-delta modulators, having the reference 28$_I$, specifically processes the signal $I^p$. The other, having the reference 28$_Q$, specifically processes the signal $Q^p$. These two sigma-delta modulators have a low output resolution since high carrier frequencies can be attained in exchange for a reduced resolution of the modulated signals. Thus, from a quantified signal over N bits, a sigma-delta modulator such as modulators 28$_I$ and 28$_Q$ performs a filtering function of the low-pass or band-pass type by producing an output signal quantified over M bits (for example three levels +1, 0, −1 when M=1.5 bits), where M is less than N.

Similarly, the second channel 30$_I$, 30$_Q$ includes two sigma-delta modulators to accomplish a modulation at the desired transmission carrier frequency of the signals $I''$ and $Q''$. One of these two sigma-delta modulators, having the reference 30$_I$, specifically processes the signal $I''$. The other, having the reference 30$_Q$, specifically processes the signal $Q''$. These two sigma-delta modulators are also low-resolution and perform a filtering function of the low-pass or band-pass type by producing output signals quantified over M bits.

The settings of the sigma-delta modulators 28$_I$, 28$_Q$, 30$_I$, 30$_Q$ are chosen in accordance with the standard chosen for the radiofrequency transmission such that the quantification noise which they generate is rejected as far as possible outside the frequency band corresponding to the chosen standard, in order that the signal-to-noise ratio of the signals quantified over M bits is the highest possible in this frequency band.

Sigma-delta modulators are known to the skilled man in the art and will not be described in greater detail. For more details concerning the architecture and operation of these modulators, reference may be made, for example, to the document entitled "An overview of sigma-delta converters" by P. M. Aziz, H. V. Sorensen and J. Van Der Spiegel, IEEE Signal Processing Magazine, vol. 13, no. 1, January 1996.

The digital generator 12 includes, at the outputs of the sigma-delta modulators $28_I$, $28_Q$, $30_I$, $30_Q$ of the two modulation channels, an additional digital signal processing module 32 the function of which is to optimise the spectrum of the modulated digital signals, and to prepare for a digital/analog conversion. Indeed, although the generator 12 is digital, the stage 14 of filtering and amplification of the radiofrequency signals produced by the generator 12, for its part, still consists of analog elements.

At its interface with the filtering and amplification stage 14, the digital generator 12 therefore includes two digital/analog conversion devices 34 and 36, one for each modulation channel $28_I$, $28_Q$ and $30_I$, $30_Q$. These two digital/analog conversion devices supply two identical-amplitude modulated analog signals $s_a^p(t)$ and $s_a^n(t)$.

Each digital/analog conversion device 34, 36 includes, for example, an output buffer, which converts the digital signals into current pulses, together with a current source controlled by this output buffer.

It will thus be noted that the digital/analog conversion devices 34, 36 are very simple, are able to operate at a very high frequency of between 5 and 10 GHz, and produce very short pulses.

The filtering and amplification stage 14 includes two analog band-pass filtering devices, one for each modulation channel and for each of the two identical-amplitude analog modulated signals, operating in a predetermined transmission frequency band. In a preferred embodiment these two band-pass filtering devices 38 and 40 are very selective filters, notably BAW-CRF filters ("Bulk Acoustic Wave-Coupled Resonator Filter"). They greatly attenuate the spectrum of the signals delivered by the digital generator 12 outside the chosen transmission frequency band, notably to eliminate with greater accuracy the quantification noise generated by the sigma-delta modulators $28_I$, $28_Q$, $30_I$, $30_Q$. For more details concerning these BAW-CRF filters and their advantages in such an architecture, notably in combination with the above-mentioned sigma-delta modulators, reference will be made to the article by P. Wurm and A. Shirakawa, entitled "Radio transmitter architecture with all-digital modulator for opportunistic radio and modern wireless terminals", CogART 2008, Proceedings on 2008 First International Workshop on Cognitive Radio and Advanced Spectrum Management, 14 Feb. 2008.

The filtering and amplification stage 14 also includes an amplification module 42 including two separate power amplification channels each connected to the current source of the corresponding digital/analog conversion device.

The first amplification channel, associated with the first modulation channel, includes a first amplifier 44, the gain- and phase-shift characteristics of which will be noted henceforth $G_p$ and $\alpha_p$, receiving the signal $s_a^p(t)$ at input and supplying a signal $s_o^p(t)$ at output. The second amplification channel, associated with the second modulation channel, includes a second amplifier 46, the gain- and phase-shift characteristics of which will be noted henceforth $G_n$ and $\alpha_n$, receiving the signal $s_a^n(t)$ at input and supplying a signal $s_o^n(t)$ at output. The inevitable differences between the settings $G_p$ and $\alpha_p$, firstly, and $G_n$ and $\alpha_n$, secondly, lead to a gain and phase shift which it is possible to correct by calibration for a satisfactory recombination of the signals $s_o^p(t)$ and $s_o^n(t)$. A preferred embodiment of this calibration will be described in detail with reference to FIGS. 3A and 3B.

The amplifiers 44 and 46 receive signals which have been transformed, either by the first means 24, or by the second means 26.

Since the signals transformed by the first means 24 have identical and constant amplitudes, the gains of the amplifiers 44 and 46 are regulated by a gain-control device 48 in order that the amplifiers operate in saturated mode when they receive these signals. The gain control device 48 is integrated in the amplification module 42 but receives a gain setting from the additional digital signal processing module 32. The additional digital processing module 32 determines the gain setting according to a power rating required for transmission by the antenna.

Since the signals transformed by the second means 26 have identical but variable amplitudes which are less than the constant amplitudes of the signals transformed by the first means 24, they are likely to be subject to the distortions relating to the AM/AM and AM/PM characteristics of the amplifiers 44 and 46. It is possible to correct these distortions by application of a predistortion method. Two preferred predistortion method embodiments will be described in detail with reference to FIGS. 4A, 4B and 5A, 5B.

Lastly, the filtering and amplification stage 14 includes a recombination module 50 including means 52 for post-filtering and recombination of both signals $s_o^p(t)$ and $s_o^n(t)$ originating from the two amplifiers 44 and 46 for the formation of a radiofrequency signal, which is phase- and amplitude-modulated around the chosen transmission carrier frequency, and which is intended to be transmitted by the antenna 16.

These post-filtering and recombination means 52 include, for example, BAW-CRF-type filters connected in a known manner to accomplish this recombination. These filters also advantageously enable the desired high power levels to be satisfactorily maintained, the quantification noise reduction accomplished by the filtering devices 38 and 40 to be completed, and an impedance adaptation to be accomplished with the antenna 16. Moreover, in systems of the "full-duplex" type they enable the transmission (TX) and reception (RX) channels to be correctly separated.

According to a second aspect of the invention, the system 10 for transmission of radiofrequency signals also includes an internal calibration circuit 54. As mentioned previously, the differences between the settings $G_p$ and $\alpha_p$ of the amplifier 44, firstly, and $G_n$ and $\alpha_n$ of the amplifier 46, secondly, lead to a gain and phase shift which it is possible to correct by calibration. This phase and amplitude calibration is necessary for all traditional systems with LINC architecture. It is also desirable for the architecture presented above, according to the first aspect of the invention. It is generally external, and accomplished only once during the design/manufacture of the radiofrequency transmission system.

The fact that a specific internal calibration circuit 54 is included in the radiofrequency signal transmission system 10 enables this calibration to be accomplished at any time, repeatedly and completely transparently by the system 10.

This calibration circuit 54 includes a coupling device 56 positioned in the recombination module 50 in the power supply of the antenna 16 at the output of the post-filtering and recombination means 52. It enables the calibration circuit 54 to recover a portion $P_{RFIN}$ of the transmission power $P_{OUT}$, proportional to the latter. If the dB attenuation of the signal in the calibration circuit 54 is noted $A_{dB}$, this portion $P_{RFIN}$ is given by the following relationship:

$$(P_{RFIN})_{dB} = (P_{OUT})_{dB} - A_{dB}.$$

This calibration circuit 54 also includes a logarithmic amplifier 58 which receives at input this portion $P_{RFIN}$ of the transmission power. The logarithmic amplifier 58 is, for example, installed in the amplification module 42 and supplies an output voltage $V_{OUT}$ proportional to the portion $P_{RFIN}$ of transmission power which it receives:

$V_{OUT} = \lambda \cdot [(P_{RFIN})_{dB} - (P_{INT})_{dB}]$, where $P_{RFIN}$ represents the attenuation in dB in the logarithmic amplifier 58.

In practice it is simple to design the logarithmic amplifier 58 with very satisfactory linearity over a 50 dB range supplying an output voltage over a range of 1V. This leads to an output accuracy of 20 mV/dB.

Since the generator 12 of radiofrequency signals is digital, the calibration circuit 54 also includes an analog/digital converter 60 installed in the digital generator 12. By means of this converter, the analog voltage $V_{OUT}$ supplied by the logarithmic amplifier 58 is converted into a digital magnitude, for example over 10 bits. For a required calibration accuracy of 0.1 dB, variations of 2 mV in relation to this analog voltage $V_{OUT}$ taking its values from a range of 1 V must be able to be detected. This requirement is effectively satisfied with a converter expressing its output values over 10 bits (i.e. 1024 possible different output values).

In terms of processing speed, a calibration is a slow process which does not impose any particular requirement on the processing speed of the converter 60.

The internal calibration circuit 54 therefore supplies the radiofrequency generator 12 with information concerning the power, i.e. in the same manner as it does concerning the amplitude, of the transmitted radiofrequency signal. Using only this information, it is possible to implement a simple calibration method the aim of which is to process the signals originating from the digital processing device 20 in order to compensate for the effects of the differences between the gain and phase settings of the two amplifiers 44 and 46. This calibration method can be implemented in a calibration module 62 of the internal circuit 54, positioned at the output of the converter 60 in the radiofrequency generator 12.

It may be observed that this internal calibration circuit 54 has a first advantage relating to its simplicity of use.

Moreover, although it is advantageously integrated in the previously described transmission system 10, it will be noted that its advantage is not restricted to this architecture. It could equally well be integrated in a transmission system the radiofrequency signal generator of which is at least partially analog. It could notably be integrated in a transmission system in which the modulation is analog. But it could also be integrated in a transmission system in which the module producing the information-carrying signal and the processing device are analog: in this case it would not need to include the converter 60.

This second aspect of the invention is also independent of the first aspect of the invention. Indeed, it could be advantageously integrated in a transmission system the digital processing device of which does not operate in the same manner as the one previously described. In particular it could be advantageously integrated in an LINC architecture.

Furthermore, the internal calibration circuit 54 has a second advantage. Using only the information relating to the power, or amplitude, of the transmitted radiofrequency signal, it is also possible to implement, with this circuit, a simple predistortion method the purpose of which is to process the signals originating from the digital processing device 20 in order to compensate for the non-linearity of the amplifiers 38 and 40 if these are not used only in a gain saturation zone. This is, for example, the case of the previously described transmission system 10 in connection with the operation of the digital processing device 20 according to the first aspect of the invention: in this case some of the processed signals are transformed by the means 26 to form signals having identical but variable amplitudes, which leads to a use of the amplifiers 38 and 40 in a variable gain zone. This can also be the case of other workings independent from the first aspect of the invention. A single internal circuit of very simple design can thus perform the functions of a calibration circuit and a predistortion circuit. As previously with calibration, the predistortion method can be implemented in the calibration module 62, which then becomes a calibration and predistortion module.

In light of the foregoing, it is clear that the second aspect of the invention, although advantageously combined with the first aspect, remains independent of the latter and has its own technical advantages.

As previously stated, a calibration method and two predistortion methods able to be implemented in module 62 using this simple internal calibration and predistortion circuit 54 will be described in detail with reference to FIGS. 3A, 3B, 4A, 4B, 5A and 5B.

An embodiment of the processing method implemented in the digital processing device 20 will firstly be described in detail with reference to FIGS. 2A, 2B and 2C.

In a first step E1 indicated in FIG. 1, the complex digital information-carrying signal $s_i(t)$ is supplied at the input of the means of comparison 22. In the course of this step its variable amplitude $A_i(t)$ is compared to a constant predetermined value $A_{MIN}$, for example defined as being equal to half the maximum value $A_{MAX}$ which it can take.

If, at the output of these means of comparison 22, the amplitude of the information-carrying signal is greater than this predetermined value $A_{MIN}$ step E2 is then executed, in which the signal $s_i(t)$ is processed by the first means of transformation 24. The configuration of FIG. 2A is then reached.

Figure 2A:
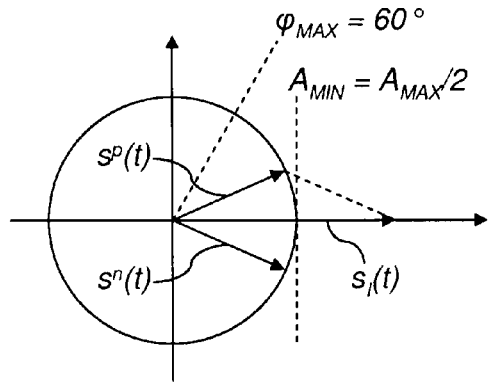
FIGS. 2A, 2B and 2C illustrate, using a vector representation, two embodiments of a method of processing of a signal carrying information intended to be transmitted by radiofrequency signal implemented in the transmission system of FIG. 1, FIGS. 3A and 3B illustrate, using a vector representation, the working principle of a method of calibration implemented in the transmission system of FIG. 1, FIGS. 4A to 4F partially illustrate, using a vector representation, the working principle of a first method of predistortion implemented in the transmission system of FIG. 1, FIGS. 5A and 5B partially illustrate, using a vector representation, the working principle of a second method of predistortion implemented in the transmission system of FIG. 1, FIGS. 6A and 6B illustrate graphically the respective spectral efficiencies of transmission systems of the state of the art and according to the invention, for an OFDM-type transmission.

In this FIG. 2A the signals are represented as vectors in the complex plane, taking the signal $s_i(t)$ as a reference mark to define the abscissa axis. The signal $s_i(t)$ can then be defined as the vector sum of two signals $s'(t)$ and $s''(t)$ of identical and constant amplitude of value $A_{MIN}$, and the opposing phase shifts of which $\phi(t)$ and $-\phi(t)$ relative to $s_i(t)$ vary according to the values of the information-carrying signal: in particular, in the non-restrictive example illustrated in FIG. 2A, $\phi(t)$ varies between 0 (for $A_i(t)=A_{MAX}$) and $\phi_{MAX}=60°$ (for $A_i(t)=A_{MIN}=A_{MAX}/2$).

If, at the output of the means of comparison 22, the amplitude of the information-carrying signal is greater than the predetermined value $A_{MIN}$ step E3 is then executed, in which the signal $s_i(t)$ is processed by the second means of transformation 26. According to a first possible variant, the configuration of FIG. 2B may then be reached.

Figure 2B:
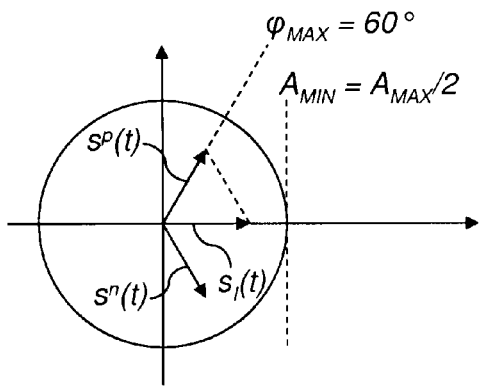

In this FIG. 2B, the signal $s_i(t)$ may be defined as the vector sum of two signals $s'(t)$ and $s''(t)$ of opposing and constant phase shifts of respective values $\phi_{MAX}=60°$ and $-\phi_{MAX}=-60°$, and the identical amplitudes of which vary according to the values of the information-carrying signal: in particular, in the non-restrictive example illustrated in FIG. 2B, they vary between 0 (for $A_i(t)=0$) and $A_{MIN}$ (for $A_i(t)=A_{MIN}$).

The phase saturation which occurs when changing from the configuration of FIG. 2A (constant amplitude equal to $A_{MIN}$, variable phase between 0 and $\phi_{MAX}$) to that of FIG. 2B (variable amplitude between 0 and $A_{MIN}$, constant phase equal to the saturation value $\phi_{MAX}$) can then lead, at the output of the sigma-delta modulators, to a broadening of the spectrum of the modulated signals, which is prejudicial for certain broadband applications.

Figure 2C:
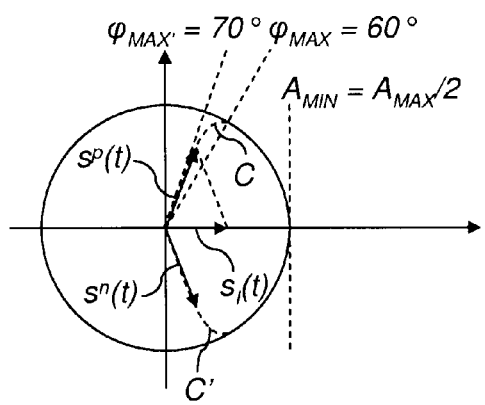

In this case a possible variant to configuration 2B is the one illustrated in FIG. 2C. In this figure the signal $s_i(t)$ is still defined as the vector sum of two signals $s^p(t)$ and $s''(t)$ of opposing phase shifts relative to $s_i(t)$, but these signals describe graphs C and C', according to which the phase shifts $\phi(t)$ and $-\phi(t)$ gradually change, from $\phi_{MAX}=60°$ and $-\phi_{MAX}=-60°$, to approach new maximum values, $\phi_{MAX}=70°$ and $-\phi_{MAX}=-70°$ for example, as their variable identical amplitudes decrease, but these new maximum values are attained only when these amplitudes reach 0, so as to prevent any saturation of the phase. In other words, along these graphs C and C', the two signals $s^p(t)$ and $s''(t)$ are of opposing phase shifts, but these phase shifts and their identical amplitudes vary according to the values of the information-carrying signal. More specifically, the graphs C and C' are configured such that the phase undergoes a gentle compression instead of a saturation.

An embodiment of a method of calibration able to be implemented in the transmission system 10, particularly using the internal calibration circuit 54 and its module 62, will now be described in detail with reference to FIGS. 3A and 3B.

To simplify the calculations let it be supposed that the differences between the settings $G_p$ and $\alpha_p$ of the amplifier 44, firstly, and $G_n$ and $\alpha_n$ of the amplifier 46, secondly, lead to a gain shift $\Delta$ and phase shift $\alpha$ of the signal $s^p(t)$ relative to the signal $s''(t)$ and that the latter has a unit amplitude. Let it also be supposed that the filtering devices of the transmission system are ideal and cause no additional shifts. Finally, let it be supposed that the amplifiers 44 and 46 are used with gain saturation.

In a first calibration step, the signal generator 12 produces two signals $s^p(t)$ and $s''(t)$ in antiphase.

After amplification these two signals become, as previously mentioned, $s_o^p(t)$ and $s_o''(t)$.

If the amplification module generated no gain or phase shift, the resulting radiofrequency signal $s_o(t)=s_o^p(t)+s_o''(t)$ should be zero.

But since there is a shift between the two amplifiers, for $s_o''(t)=\exp(j\cdot(\theta(t)+\pi))$, we have $s_o^p(t)=(1+\Delta)\cdot(\cos(\alpha)+j\sin(-\alpha))\cdot\exp(j\cdot\theta(t))$. Hence, at output, a radiofrequency signal the amplitude of which is non-zero:

$$|s_o(t)| = \sqrt{[\cos(\alpha)\cdot(1+\Delta)-1]^2 + [\sin(\alpha)\cdot(1+\Delta)]^2}.$$

Figure 3A:
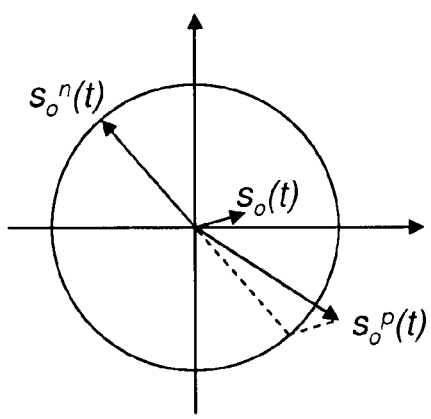
Figure 3B:
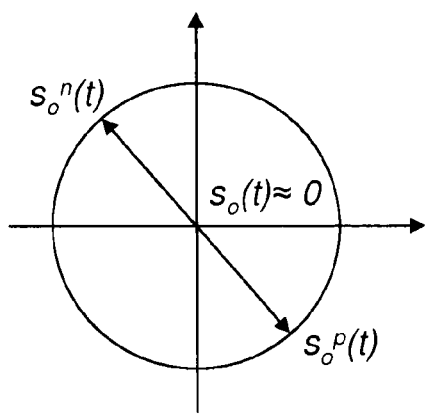

The configuration of FIG. 3A is then reached.

In a second calibration step, the amplitude of the output signal is measured and returned to the signal generator 12 by the internal calibration circuit 54.

Observing that the measured amplitude $|s_o(t)|$ is a monotone function of the gain shift $\Delta$ and phase shift a of the two amplifiers 44 and 46, it is necessary merely to apply a gain and phase precorrection to at least one of the two signals $s^p(t)$ and $s''(t)$, in the course of a third calibration step, and then to reproduce iteratively the abovementioned three calibration steps using, for example, an optimisation method such as a gradient descent, to converge towards a minimum the final value of which reflects the quality of the calibration.

At the end of the iteration, for example when the configuration of FIG. 3B has been reached, the gain and phase precorrection values leading to this configuration are kept in memory and will be applied subsequently when generating and transmitting any signal carrying information intended to be transmitted in the form of a radiofrequency signal by the transmission system 10.

Using this calibration method implemented by the internal calibration circuit 54, which can furthermore be executed at any time (except when signals are being transmitted) and completely transparently, it is clear that even if the amplifiers 44 and 46 have a gain and phase shift, and even if the latter is likely to change over time, it can be corrected simply and efficiently.

Figure 4A:
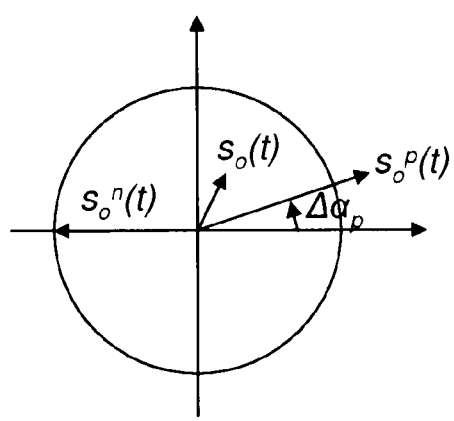
Figure 4B:
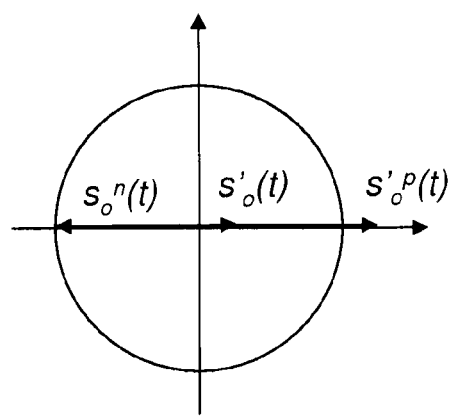

A first embodiment of a method of predistortion able to be implemented in the transmission system 10, particularly using the internal calibration circuit 54 and its module 62, which also perform a predistortion function, will now be described in detail with reference to FIGS. 4A and 4B.

As was seen above in the description of the first aspect of the invention, a predistortion of the two signals of identical amplitudes and opposing phase shifts can be necessary, or at least advantageous, when their amplitudes are variable (configurations of FIGS. 2B and 2C, for example) and when the amplifiers 44 and 46 do not always operate with gain saturation.

This can be implemented by means of prior performance of a predistortion method to estimate values of predistortion coefficients to be applied to the gains and phases of the two signals of identical amplitudes and of opposing phase-shifts.

In a first predistortion step, the signal generator 12 produces two signals $s^p(t)$ and $s''(t)$ in antiphase (for example respective phases 0 and $\pi$) and of equal amplitudes. For example, $s^p(t)=A$ and $s''(t)=-A$. When the amplifiers are not operating with gain saturation, the settings $G_p$ and $\alpha_p$ of the amplifier 44, firstly, and $G_n$ and $\alpha_n$ of the amplifier 46, secondly, depend on the value of A according to the following relationships:

$$s_o^p(t)=G_p(A)\cdot\exp(j\cdot\alpha_p(A))\cdot A, \text{ and}$$

$$s_o''(t)=-G_n(A)\cdot\exp(j\cdot\alpha_n(A))\cdot A.$$

In a second predistortion step, a calculation of predistortion coefficients relating to the gain $G_p(A)$ of the amplifier 44 is made.

In the course of this step the signal $s^p(t)$ is adjusted to a level such that the power $P^p(-20$ dB$)$ being output from the amplifier 44 is 20 dB below its saturation power rating $P^pSAT$:

$$P^p(-20 \text{ dB})=P^pSAT-20 \text{ dB}.$$

In addition, the signal $s''(t)$ is set at a zero level.

The power of the signal $s^p(t)$ is then increased by 1 dB and the new power rating $P^p(-19$ dB$)$ at the output of the amplifier 44 is measured. A gain constant $G_p=P^p(-19$ dB$)-P^p(-20$ dB$)$ is then deduced from this.

It is then possible to increase the power of the signal $s^p(t)$ in steps of 1 dB, and then to apply an amplitude predistortion associated with each power level in order to impose a constant gain equal to the initially estimated value of $G_p$. In this way, the increase in power at the output of the amplifier 44 appears linear.

In a third predistortion step, a calculation of predistortion coefficients relating to the gain $G_n(A)$ of the amplifier 46 is made.

In the course of this step, the signal $s''(t)$ is adjusted to a level such that the power $s''(t)$ being output from the amplifier 44 is 20 dB below its saturation power rating $s''(t)$:

$$P''(-20 \text{ dB})=P''SAT-20 \text{ dB}.$$

In addition, the signal $s^p(t)$ is set at a zero level.

The power of the signal $s''(t)$ is then increased by 1 dB and the new power $P''(-19$ dB$)$ at the output of the amplifier 44 is measured. A gain constant $G_n=P''(-19$ dB$)-P''(-20$ dB$)$ is then deduced from this.

It is then possible to increase the power of the signal $s''(t)$ in steps of 1 dB, and then to apply an amplitude predistortion associated with each power level in order to impose a constant gain equal to the initially estimated value of $G_n$. In this way, the increase in power at the output of the amplifier 46 appears linear.

In a fourth predistortion step, a calculation of predistortion coefficients relating at once to the phase $\alpha_p(A)$ of the amplifier 44 and to the phase $\alpha_n(A)$ of the amplifier 46 is made.

During this step the amplitudes of $s^p(t)$ and $s''(t)$ are set at values $A_{p,-20\,dB}$ and $A_{n,-20\,dB}$, in order to obtain power levels at the outputs of the amplifiers 20 dB below their common saturation power rating $P_{SAT}$ (after calibration).

The output power measured by the internal calibration circuit 54 is then proportional to $|s_o(t)|^2=|s_o^p(t)+s_o''(t)|^2$, with:

$$s_o^p(t)=G_p \cdot \exp(j \cdot \alpha_{p,-20dB}) \cdot A_{p,-20dB}, \text{ and}$$

$$s_o''(t)=-G_n \cdot \exp(j \cdot \alpha_{n,-20dB}) \cdot A_{n,-20dB}.$$

At a power rating 20 dB below the common saturation power rating $P_{SAT}$, it is reasonable to expect that $\alpha_{p,-20dB} \approx \alpha_{n,-20dB} \approx 0$.

In addition, using the second and third predistortion steps it is possible to define a common output amplitude $A_O=G_p \cdot A_{p,-20dB}=G_n \cdot A_{n,-20dB}$.

As a consequence $s_o(t)=0$.

After this, the amplitude of the first signal $s^p(t)$ is increased such that the power at output of the first amplifier 44 is increased by 1 dB whilst the amplitude of the second signal $s''(t)$ is maintained at its value $A_{n,-20\,dB}$. The configuration of FIG. 4A is then reached, in which an angle variation $\Delta\alpha A_{p,-19dB}$ may be calculated.

The following is then obtained: $(G_p \cdot A_{p,-19dB})=F \cdot (G_p \cdot A_{p,-20dB})=F \cdot A_O$, with F=1.122 (i.e. 1 dB).

Consequently: $s_o(t)=F \cdot A_O \cdot \exp(j \cdot \Delta\alpha A_{p,-19dB})-A_O$, $$\left|\frac{s_o(t)}{A_O}\right| = |F \cdot (\cos(\Delta\alpha_{p,-19\,dB}) + j \cdot \sin(\Delta\alpha_{p,-19\,dB})) - 1|,$$

$$\left|\frac{s_o(t)}{A_O}\right|^2 = 1 + F^2 - 2 \cdot F \cdot \cos(j \cdot \Delta\alpha_{p,-19\,dB}), \text{ hence}$$

$$|\Delta\alpha_{p,-19\,dB}| = \arccos\left(\frac{1+F^2-|s_o(t)|^2/|A_o|^2}{2 \cdot F}\right).$$

Indeed, only the absolute value of the angle variation is returned to this step, since the arccos function returns only positive values for small angle values.

To determine the sign of the angle variation $\Delta\alpha_{p,-19dB}$, possible, for example, to add the previously returned absolute value to the phase of the signal $s^p(t)$.

The following is then obtained:

$$s'_o(t)=F \cdot A_O \cdot \exp(j \cdot (\Delta\alpha_{p,-19dB}+|\Delta\alpha_{p,-19dB}|))-A_O.$$

If $\Delta\alpha_{p,-19dB}+|\Delta\alpha_{p,-19dB}|=0$, then $$\left|\frac{s'_o(t)}{A_O}\right|^2 = 1 + F^2 - 2 \cdot F$$

and this new measured value is lower than the previous one, proving that $\Delta\alpha_{p,-19dB}$ is negative. The configuration of FIG. 4B is then reached.

Figure 4C:
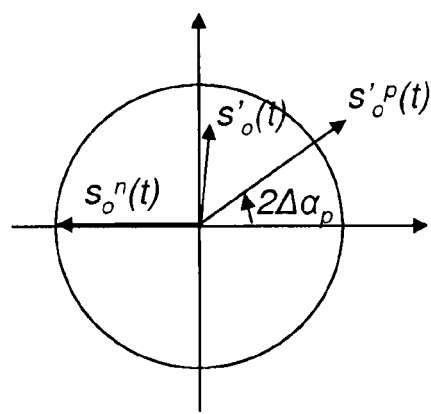

If $\Delta\alpha_{p,-19dB}+|\Delta\alpha_{p,-19dB}|=2\Delta\alpha_{p,-19dB}$, then:

$$\left|\frac{s'_o(t)}{A_O}\right|^2 = 1 + F^2 - 2 \cdot F \cdot \cos(j \cdot 2\Delta\alpha_{p,-19\,dB})$$

and this new measured value is higher than the previous one, proving that $\Delta\alpha_{p,-19dB}$ positive. The configuration of FIG. 4C is then reached.

The value of $\Delta\alpha_{p,-19dB}$ is then deduced from this.

Figure 4D:
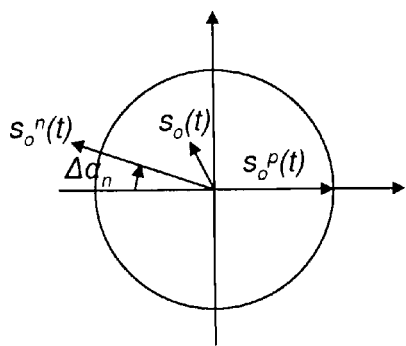

By proceeding in a similar manner, in the configuration of FIG. 4D, it is possible also to determine the value of $|\Delta\alpha_{n,-19dB}|$:

$$s_o(t)=A_O-F \cdot A_O \cdot \exp(j \cdot \Delta\alpha_{n,-19dB}),$$

$$\left|\frac{s_o(t)}{A_O}\right|^2 = 1 + F^2 - 2 \cdot F \cdot \cos(j \cdot \Delta\alpha_{n,-19\,dB}), \text{ hence}$$

$$|\Delta\alpha_{n,-19\,dB}| = \arccos\left(\frac{1+F^2-|s_o(t)|^2/|A_o|^2}{2 \cdot F}\right).$$

To determine the sign of the angle variation $\Delta\alpha_{n,-19dB}$, as previously, the absolute value returned above is added to the phase of the signal $s''(t)$.

The following is then obtained:

$$s'_o(t)=A_O-F \cdot A_O \cdot \exp(j \cdot (\Delta\alpha_{n,-19dB}+|\Delta\alpha_{n,-19dB}|)).$$

Figure 4E:
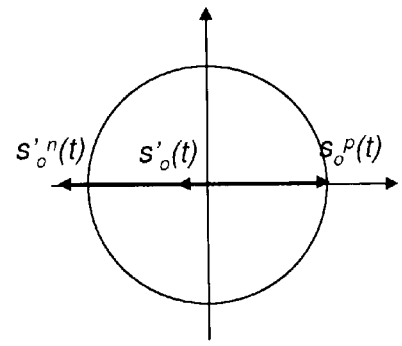

If $\Delta\alpha_{n,-19dB}+|\Delta\alpha_{n,-19dB}|=0$, then $$\left|\frac{s'_o(t)}{A_O}\right|^2 = 1 + F^2 - 2 \cdot F$$

and this new measured value is lower than the previous one, proving that $\Delta\alpha_{n,-19dB}$ is negative. The configuration of FIG. 4E is then reached.

Figure 4F:
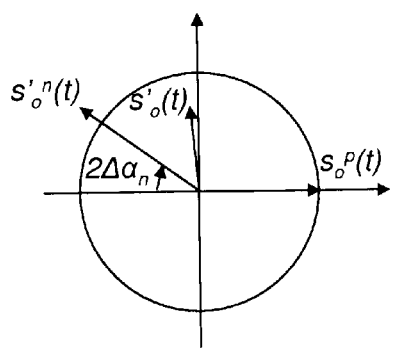

If $\Delta\alpha_{n,-19dB}+|\Delta\alpha_{n,-19dB}|=2\Delta\alpha_{n,-19dB}$, then:

$$\left|\frac{s'_o(t)}{A_O}\right|^2 = 1 + F^2 - 2 \cdot F \cdot \cos(j \cdot 2\Delta\alpha_{n,-19dB})$$

and this new measured value is higher than the previous one, proving that $\Delta\alpha_{n,-19dB}$ is positive. The configuration of FIG. 4F is then reached.

The value of $\Delta\alpha_{n,-19dB}$ is then deduced from this.

Using these values it is possible to compensate for the phase distortions introduced by the amplifiers 44 and 46 at a power rating of −19 dB below the common saturation power rating $P_{SAT}$. Moreover, since it is also possible to compensate for the gain distortions by means of the second and third predistortion steps, this guarantees the possibility of recovering at $P_{SAT}$−19 dB signals of the same amplitude and in antiphase, as was possible at −20 dB, by making the following corrections:

$$s^p(t)=A_{p,-19dB} \cdot \exp(-j \cdot \Delta\alpha_{p,-19dB}), \text{ and}$$

$$s''(t)=A_{n,-19dB} \cdot \exp(-j \cdot \Delta\alpha_{n,-19dB}).$$

As a consequence, $s_o(t)=0$ is recovered at −19 dB.

By proceeding as above, it is thus possible to determine the values of $\Delta\alpha_{p,-18dB}$ and $\Delta\alpha_{n,-18dB}$, and then, gradually, the values of $\Delta\alpha_{p,x}$ and $\Delta\alpha_{n,x}$ until saturation $P_{SAT}$.

The values of the AM/PM distortion at each power level is then deduced by the following relationships:

$$\alpha_p(y \text{ dB}) = \sum_{x=-19dB}^{x=-y\,dB} \Delta\alpha_{p,x} \text{ and } \alpha_n(y \text{ dB}) = \sum_{x=-19dB}^{x=-y\,dB} \Delta\alpha_{n,x}.$$

It is clear that this first method of predistortion can be implemented by the internal calibration circuit 54, since only the output power (or amplitude) information is useful in calculating the predistortion coefficients to be applied to the signals produced by the generator 12. As with calibration, this method can also be executed at any time (except when signals are being transmitted), and completely transparently, such that even if the amplifiers 44 and 46 have gain (AM/AM) and phase (AM/PM) non-linearities, and even if these are likely to change over time, they can be corrected simply and efficiently.

Figure 5A:
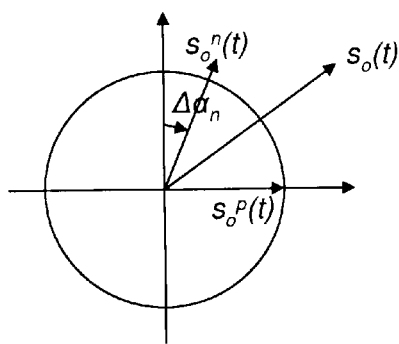
Figure 5B:
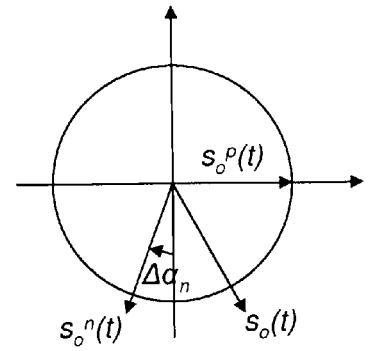

A second embodiment of a method of predistortion able to be implemented in the transmission system 10, particularly using the internal calibration circuit 54 and its module 62, will now be described in detail with reference to FIGS. 5A and 5B.

In this second embodiment, unlike the first, the calculations of the amplitude and phase predistortion coefficients are made simultaneously. Each step in this method makes an amplitude and phase correction at each power level.

According to this second embodiment, the signal generator 12 produces signals $s^p(t)$ and $s''(t)$ in phase quadrature according to two configurations applied successively: in a first step, the angle between the two signals $s^p(t)$ and $s''(t)$ is +90° (configuration of FIG. 5A); in the following step, the angle between the two signals $s^p(t)$ and $s''(t)$ is −90° (configuration of FIG. 5B).

Firstly, the amplitudes of $s^p(t)$ and $s^p(t)$ are set at the above-mentioned values $A_{p,-20\,dB}$ and $A_{n,-20\,dB}$, in order to obtain power ratings at the outputs of the amplifiers 20 dB below their common saturation power rating $P_{SAT}$. As with the first predistortion method, at this power rating it is reasonable to expect that $\alpha_{p,-20dB} \approx \alpha_{n,-20dB} \approx 0$.

The amplitude of the second signal $s''(t)$ is then increased by 1 dB and the amplitude of the output signal is then measured twice using the internal calibration circuit 54: once in each configuration 5A and 5B.

The following is then obtained:

$$s_{o,a}(t) = G_{p,-20dB} \cdot A_{p,-20dB} + G_{n,-19dB} \cdot A_{n,-19dB} \cdot \exp\left(j \cdot \left(\frac{\pi}{2} + \Delta\alpha_{n,-19dB}\right)\right),$$

and $$s_{o,b}(t) = G_{p,-20dB} \cdot A_{p,-20dB} + G_{n,-19dB} \cdot A_{n,-19dB} \cdot \exp\left(j \cdot \left(-\frac{\pi}{2} + \Delta\alpha_{n,-19dB}\right)\right).$$

If it is also supposed that:

$$G_{p,-20dB} \cdot A_{p,-20dB} = A_O, \text{ and}$$

$$G_{n,-19dB} \cdot A_{n,-19dB} = F_{n,-19dB} \cdot A_O,$$

where $F_{n,-19\,dB}$ is an unknown, a system of two equations with two unknowns is obtained:

$$|s_{o,a}(t)|^2 = A_O^2 \cdot (1 + 2 \cdot F_{n,-19dB} \cdot \sin\Delta\alpha_{n,-19dB} + F_{n,-19dB}^2),$$
and $$|s_{o,b}(t)|^2 = A_O^2 \cdot (1 + 2 \cdot F_{n,-19dB} \cdot \sin\Delta\alpha_{n,-19dB} + F_{n,-19dB}^2).$$

This system gives the following result:

$$F_{n,-19dB} = \sqrt{\frac{|s_{o,a}|^2 + |s_{o,b}|^2}{2 \cdot A_O^2} - 1}, \text{ and}$$

$$\Delta\alpha_{n,-19\,dB} = \arcsin\left(\frac{|s_{o,a}|^2 - |s_{o,b}|^2}{4 \cdot A_O^2 \cdot F_{n,-19\,dB}}\right).$$

A similar approach is used to determine $F_{p,-19\,dB}$ and $\Delta\alpha_{p,-19dB}$.

Using these values it is possible to compensate for the gain and phase distortions introduced by the amplifiers 44 and 46 at a power rating of −19 dB below the common saturation power rating $P_{SAT}$. This guarantees the possibility of regaining at $P_{SAT}$−19 dB signals corrected as follows:

$$s^p(t) = A_{p,-19dB} \cdot \exp(-j \cdot \Delta\alpha_{p,-19dB}), \text{ and}$$

$$s''(t) = A_{n,-19dB} \cdot \exp(-j \cdot \Delta\alpha_{n,-19dB}).$$

Starting with these corrected signals it is then possible to determine as previously $F_{p,-18\,dB}$, $\Delta\alpha_{p,-18dB}$, $F_{n,-18\,dB}$ and $\Delta\alpha_{n,-18dB}$, and then, gradually, $F_{p,x}$, $\Delta\alpha_{p,x}$, $F_{n,x}$ and $\Delta\alpha_{n,x}$ until saturation $P_{SAT}$.

The values of the AM/AM and AM/PM distortions at each power level are then deduced by the following relationships:

$$\alpha_p(y \text{ dB}) = \sum_{x=-19dB}^{x=-y\,dB} \Delta\alpha_{p,x}, \quad \alpha_n(y \text{ dB}) = \sum_{x=-19dB}^{x=-y\,dB} \Delta\alpha_{n,x},$$

$$F_p(y \text{ dB}) = \prod_{x=-19dB}^{x=-y\,dB} F_{p,x}, \quad F_n(y \text{ dB}) = \prod_{x=-19dB}^{x=-y\,dB} F_{n,x}.$$

It is clear that this second predistortion method can also be implemented simply through the presence of the internal calibration circuit 54, which then acts as an internal predistortion circuit, since only the output power (or amplitude) information is useful to calculate the predistortion coefficients to be applied to the signals produced by the generator 12.

It will furthermore be noted that an advantage of the second predistortion method over the first is that it requires a lesser dynamic in measuring the values of $|s_o(t)|$. Indeed, to accomplish this predistortion, the generator 12 produces signals in phase quadrature such that the sum of the two at output from the amplification module has a larger amplitude, and therefore a lesser dynamic, than when the signals produced are in antiphase. Moreover, this second method appears simpler and more powerful than the first.

It is clear that a processing device such as the one described in accordance with an embodiment of the first aspect of the invention is less sensitive to an imperfect gain and phase calibration than an LINC-type processing device.

In terms of energy consumption, economies can be made using this processing device if amplifiers are used of a kind such that their consumption depends on the level of amplitude of the amplified signals.

Figure 6A:
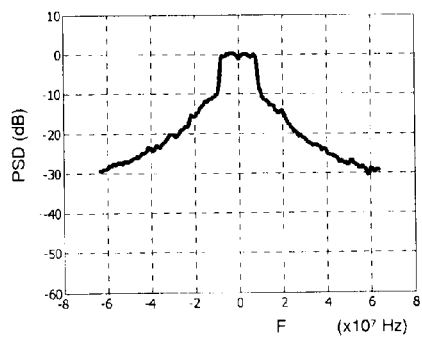
Figure 6B:
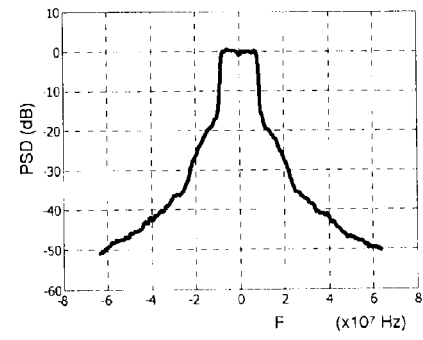

In terms of spectral modulation, another advantage is clear in light of FIGS. 6A and 6B. In the previously described digital signal generator 12 the transformation accomplished by the processing device 20 is likely to lead to a broadening of the spectrum of the two signals obtained by this transformation of the information-carrying signal generated as a baseband.

When an LINC-type transformation is applied to an OFDM-type signal the (identical) spectrum of the two signals obtained after sigma-delta modulation is very broad, as can be seen in FIG. 6A. It can be seen in this figure that a spectral breadth of at least 120 MHz is necessary to include the entire spectral density of these signals. And it is considerably broader than the OFDM signal in the original baseband (approximately 18 MHz), and even broader than the bandwidth of the analog filters which can be used. It may then be possible to envisage transmitting without excessive damage in the central channel of the band of transmission frequencies, but as soon as it is departed from the signal may be deformed.

When a transformation according to the first aspect of the invention is applied to an OFDM-type signal, the (identical) spectrum of the two signals obtained after sigma-delta modulation is substantially less broad, as can be seen in FIG. 6B.

Figure 7A:
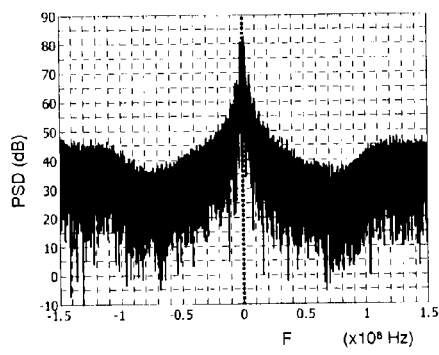
FIGS. 7A and 7B illustrate graphically the respective spectral efficiencies of transmission systems of the state of the art and according to the invention, for a WCDMA-type transmission.
Figure 7B:
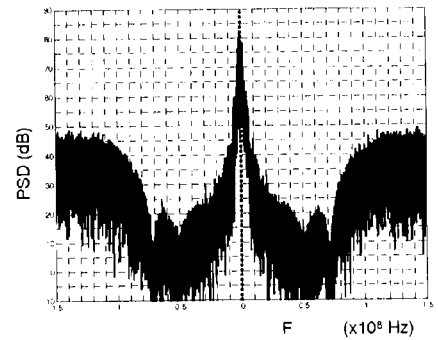

Similarly, when an LINC-type transformation is applied to a WCDMA-type signal, the (identical) spectrum of the two signals obtained after sigma-delta modulation is very broad, as can be seen in FIG. 7A. It may extend over 100 MHz. Conversely, when a transformation according to the first aspect of the invention is applied to this same WCDMA-type signal, the (identical) spectrum of the two signals obtained after sigma-delta modulation is much less broad, as can be seen in FIG. 7B. It then extends over only 25 MHz.

It is true that a processing device and a transmission system according to the invention subject the amplifiers they use to gains below their saturation gain. They then become more sensitive to the non-linearities of these amplifiers. But it has been seen that predistortion methods can be implemented through the presence of a simple internal calibration circuit which can then also perform a predistortion function without requiring any particular modification.

Lastly, it will be noted that the invention is not restricted to the previously described embodiments or to the mentioned radiofrequency transmission standards. The proposed transformation, notably according to the configurations illustrated by FIGS. 2B and 2C, but not only according to them, can be adapted to other non-mentioned modulation standards, so as to find the ideal compromise between bandwidth of the modulation, efficiency in terms of supplied power relative to energy consumption, and transmission linearity.

The invention claimed is:

1. A device for processing a signal carrying information to be transmitted using a radiofrequency signal, for transformation of the signal into two signals of identical amplitude phase-shifted respectively relative to the information-carrying signal according to two variable and opposing phase shifts, the device comprising:
   means for transforming the information-carrying signal to:
      transform the information-carrying signal into two signals of constant amplitude and of variable phase shifts according to values of the information-carrying signal, for as long as the amplitude of the information-carrying signal is greater than a predetermined value, and
      transform the information-carrying signal into two signals of variable amplitude according to the values of the information-carrying signal, when the amplitude of the information-carrying signal is less than the predetermined value.

2. A processing device according to claim 1, wherein the means for transforming further transforms the information-carrying signal into two signals of constant phases that are set in absolute value terms at a maximum value, and of amplitudes that vary according to the values of the information-carrying signal, when the amplitude of the information-carrying signal is less than the predetermined value.

3. A processing device according to claim 1, wherein the predetermined value is defined according to a distribution of the amplitude of the information-carrying signal.

4. A system for transmission of radiofrequency signals comprising:
   means for production of an information-carrying complex signal to be modulated;
   a processing device according to claim 1, for transformation of the complex signal into two signals of identical amplitude;
   means for modulating the two identical-amplitude signals including two separate modulation channels;
   means for recombining the two modulated signals of identical amplitude for formation of a radiofrequency signal to be transmitted; and
   means for transmission of the radiofrequency signal.

5. A system for transmission of radiofrequency signals according to claim 4, wherein the means for production, the processing device, and the means for modulating are digital, and wherein each modulation channel includes at least one digital sigma-delta modulator.

6. A system for transmission of radiofrequency signals according to claim 5, wherein the means for recombining are analog, and wherein the system further comprises:
   means for digital/analog conversion of both the identical-amplitude signals originating from the means of modulating, for supply of two analog signals;
   means for band-pass filtering the two analog signals in a predetermined transmission frequency band; and
   means for amplification of the two filtered analog signals for supply of two filtered and amplified analog signals to the means for recombining.

7. A system for transmission of radiofrequency signals according to claim 6, further comprising an internal calibration circuit to compensate for a gain and phase shift of the means for amplification of both filtered analog signals.

8. A system for transmission of radiofrequency signals according to claim 7, further comprising an internal predistortion circuit to compensate for a gain and/or phase non-linearity of the means for amplification of both filtered analog signals.

9. A system for transmission of radiofrequency signals according to claim 8, wherein the internal calibration circuit and the internal predistortion circuit are formed by a single circuit including a coupling device forming part of the means of recombining to recover a portion of the radiofrequency signal transmission power, and a logarithmic amplifier to transform the recovered portion into a voltage that can be used by the processing device.

10. A method for processing a signal carrying information to be transmitted using a radiofrequency signal, for transformation of the signal into two signals of identical amplitude phase-shifted respectively relative to the information-carrying signal according to two variable and opposing phase shifts, the method comprising:
   transforming the information-carrying signal into two signals of constant amplitude and of variable phase shifts according to values of the information-carrying signal, for as long as the amplitude of the information-carrying signal is greater than a predetermined value; and
   transforming the information-carrying signal into two signals of variable amplitude according to the values of the information-carrying signal, when the amplitude of the information-carrying signal is less than this predetermined value.

* * * * *